United States Patent
Koike et al.

[11] Patent Number: 5,811,319
[45] Date of Patent: Sep. 22, 1998

[54] METHODS OF FORMING ELECTRODES ON GALLIUM NITRIDE GROUP COMPOUND SEMICONDUCTORS

[75] Inventors: Masayoshi Koike; Seiji Nagai; Shiro Yamasaki, all of Aichi-ken; Masanori Murakami, Kyoto-fu; Katsuyuki Tsukui, Kyoto-fu; Hidenori Ishikawa, Kyoto-fu, all of Japan

[73] Assignee: Toyoda Gosei Co., Ltd., Aichi-ken, Japan

[21] Appl. No.: 622,045

[22] Filed: Mar. 26, 1996

[30] Foreign Application Priority Data

Mar. 27, 1995 [JP] Japan .................................. 7-094484

[51] Int. Cl.$^6$ .................................................. H01L 21/28
[52] U.S. Cl. ............................ 438/46; 438/47; 438/604; 204/192.35
[58] Field of Search .............................. 438/46, 47, 604; 257/94, 95, 96, 67, 743; 204/192.35

[56] References Cited

U.S. PATENT DOCUMENTS

| | | | |
|---|---|---|---|
| 4,954,852 | 9/1990 | Lemnios | 357/15 |
| 5,229,323 | 7/1993 | Shimada et al. | 437/176 |
| 5,281,830 | 1/1994 | Kotaki et al. | 257/94 |
| 5,317,170 | 5/1994 | Paoli et al. | 257/95 |
| 5,498,883 | 3/1996 | Lebby et al. | 257/95 |
| 5,578,839 | 11/1996 | Nakamura et al. | 257/96 |
| 5,656,832 | 8/1997 | Ohba et al. | 257/96 |

FOREIGN PATENT DOCUMENTS 3-108779  5/1991  Japan .

OTHER PUBLICATIONS

Yamasaki et al, "Sputter Etching Effects on GaAs Schottky Junctions", J. Electrochem. Soc., vol. 129, No. 12, pp. 2760–2764, Dec. 1982.

*Primary Examiner*—John Niebling
*Assistant Examiner*—Thomas G. Bilodeau
*Attorney, Agent, or Firm*—Cushman Darby & Cushman, IP Group of Pillsbury Madison & Sutro LLP

[57] ABSTRACT

A surface of a compound semiconductor having at least gallium (Ga) and nitride (N) forms a target for sputtering with inert gas, so that oxide and other attachments are removed therefrom. The sputtering the surface is carried out until a disruption layer is formed which has atomically disordered and bumpy arrangement. Following the sputtering process, metal deposition by sputtering and alloying are carried out under vacuum in the same chamber used for the sputtering processes. As a result, the contact resistance between the surface layer and the deposited electrode layer is decreased.

14 Claims, 6 Drawing Sheets

F I G. 1
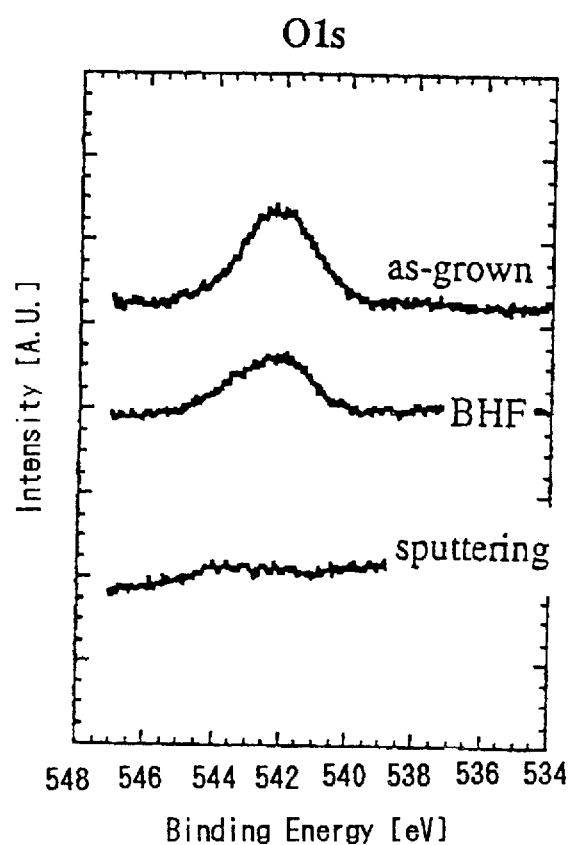

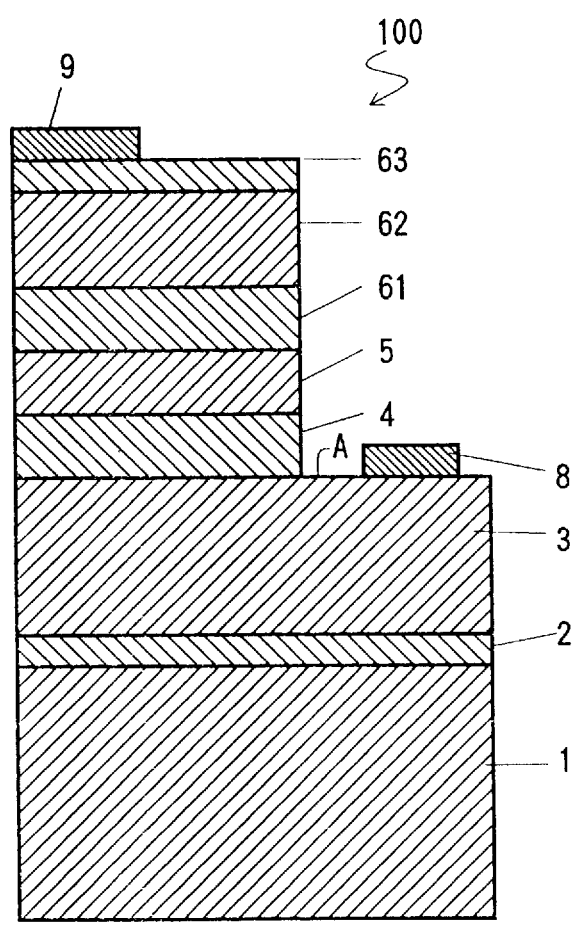
F I G. 4

METHODS OF FORMING ELECTRODES ON GALLIUM NITRIDE GROUP COMPOUND SEMICONDUCTORS

BACKGROUND OF THE INVENTION

1. Field of the Invention

The present invention relates to a method of forming electrodes on a gallium nitride (GaN) group compound semiconductor. More particularly, it relates to a method of clearing the surface of the semiconductor to improve its ohmic properties by lowering the contact resistance between the surface of the semiconductor and electrodes formed thereon.

2. Description of the Related Art

Semiconductor devices utilizing GaN group compounds such as AlGaInN have attracted much attention due to their emission of blue light. Conventionally, metal electrodes such as nickel (Ni) and aluminum (Al) are formed on such devices by vacuum evaporation after the surface of the semiconductor device is cleaned by wet chemical etching, utilizing a liquid etchant such as buffered hydrogen fluoride (BHF).

Such conventional etching, however, cannot completely remove oxide and other attachments from the surface of the semiconductor device and the metal electrodes are formed over such attachments. Consequently, the contact resistance between the surface of the device and the electrodes has been high.

SUMMARY OF THE INVENTION

Therefore, an object of the present invention is to lower the contact resistance between the surface of the gallium nitride group compound semiconductor and the electrodes formed thereon.

According to a first aspect of the invention, a method is provided for forming electrodes on a compound semiconductor including at least gallium (Ga) and nitride (N). A surface layer of the compound semiconductor is sputtered as a target with an inert gas, and a electrode layer is formed on the surface layer without exposing the surface layer to an outer air.

According to a second aspect of the invention, the electrode layer is formed under a vacuum condition by replacing the compound semiconductor with a metal target, placing it on a susceptor, and sputtering the metal target.

According to a third aspect of the invention, the surface layer of the compound semiconductor is sputtered as a target until the surface of the semiconductor is converted into a disruption layer which has a surface irregularity and a disordered lattice arrangement in an order of lattice constant.

According to a fourth aspect of the invention, alloying is carried out to the surface layer of the semiconductor without exposing the electrode layer to an outer air after the electrode layer is formed.

According to a fifth aspect of the invention, the electrode layer is formed under vacuum successively after the surface layer of the compound semiconductor is sputtered as a target.

According to a sixth aspect of the invention, the alloying is carried out under vacuum successively after the electrode layer is formed.

According to a seventh aspect of the invention, argon (Ar) is used as the inert gas.

By sputtering the surface of the GaN group compound semiconductor (including at least gallium (Ga) and nitride (N)) with argon (Ar) as the target, oxide and other attachments are completely removed from the surface. As a result, the contact resistance between the surface of the semiconductor and metal electrodes formed thereon decreases.

The surface of the GaN group compound semiconductor is sputtered with argon (Ar) as the target until the surface has disrupted atomic arrangement, or atomically bumpy surface. Accordingly, the contact resistance between the surface layer of the semiconductor and the electrode formed thereon may be even further decreased. Further treatment of the semiconductor device, including alloying followed by vapor deposition under vacuum contributed to an even lower contact resistance. By these further treatments, the contact resistance may be reduced to a minimum value and ohmic characteristics of the semiconductor may be improved in general. The function of the disruption layer was analyzed and found to smooth the alloying of the deposited metal layer effectively, and as a result lower the contact resistance.

Other objects, features, and characteristics of the present invention will become apparent upon consideration of the following description and the appended claims with reference to the accompanying drawings, all of which form a part of the specification, and wherein like reference numerals designate similar parts in the various figures.

BRIEF DESCRIPTION OF THE DRAWING

In the accompanying drawings:

FIG. 1 is a graph comparing oxygen spectra (O1s) from three samples measured by X-ray photoelectron spectroscopy (XPS);

FIG. 4 is a diagram showing the structure of a LED in Example 2; and

DETAILED DESCRIPTION OF THE PREFERRED EMBODIMENT

The invention will be more fully understood by reference to the following example.

EXAMPLE 1

A gallium nitride (GaN) substrate was utilized as an example of a compound semiconductor having at least gallium (Ga) and nitride (N), such as AlGaInN. The GaN substrate, whose surface was cleaned by an organic washing solvent, was placed on a target in a reaction chamber of a sputtering device. Then, the device was pumped out to form a vacuum in the chamber and the GaN substrate was sputtered with argon ions (Ar$^+$) injected from a normal direction by a Kaufman type ion gun under conditions of an accelerating voltage of 200 V and a current density of 20 $\mu$A/cm$^2$.

Then, the GaN substrate was replaced with a metal target and moved to be placed on a susceptor in the chamber. Keeping the vacuum state in the chamber, a nickel (Ni) electrode layer was deposited on the surface of the GaN substrate by sputtering the metal target. In that device, heat treatment, or alloying, was successively carried out on the Ni electrode layer deposited on the GaN substrate.

The obtained contact resistance between the GaN substrate and the Ni electrode layer was about $10^{-3}$ $\Omega\cdot cm^2$ although the contact resistance of conventional arrangements was about $10^{-2}$ $\Omega\cdot cm^2$. Namely, the above-described exemplary arrangement of the present invention reduced the contact resistance to one tenth of the contact resistance of conventional arrangements.

Figure 2:
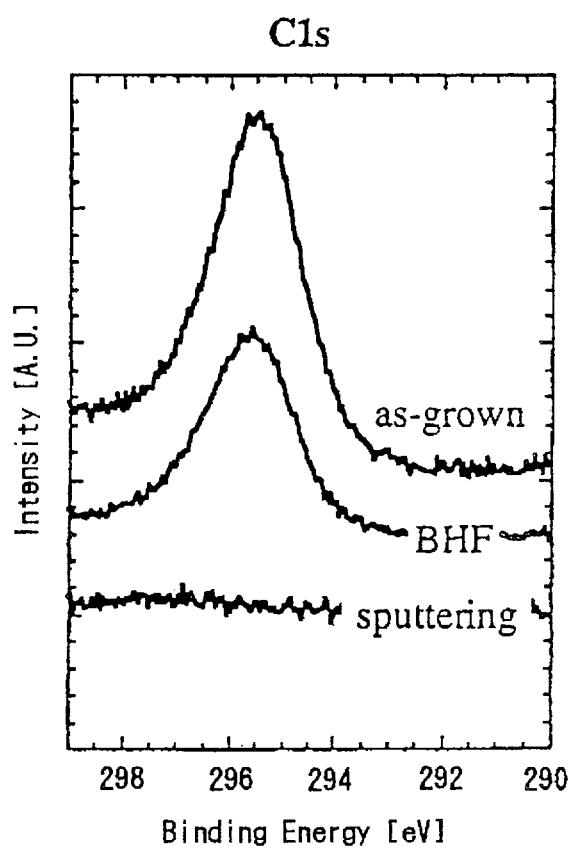
FIG. 2 is a graph comparing carbon spectra (C1s) from three samples measured by X-ray photoelectron spectroscopy (XPS)

In order to assure a sufficient washing effect achieved by sputtering with Ar, some comparative experiments were carried out. Three samples consecutively having a sapphire substrate, an aluminum nitride (AlN) buffer layer, and a GaN layer were prepared. The first sample was a GaN layer grown onto the AlN buffer layer and was left as grown, i.e., without any additional surface treatment performed on its surface. The second was treated with wet etching utilizing buffered hydrogen fluoride (BHF). The third was sputtered with argon (Ar) as a target. Then, each of the samples was analyzed by X-ray photoelectron spectroscopy (XPS), and oxygen spectra (O1s) and carbon spectra (C1s) were measured for each sample as respectively shown in FIGS. 1 and 2. The peak shape of the first sample showed that oxygen (O1s) and carbon (C1s) existed on the surface crystal of GaN layer. Although wet etching removed oxygen (O1s) and carbon (C1s) to some extent from the second sample, they still remained. In contrast to the former two samples, oxygen (O1s) and carbon (C1s) were completely removed and cleared from the third sample.

Figure 3:
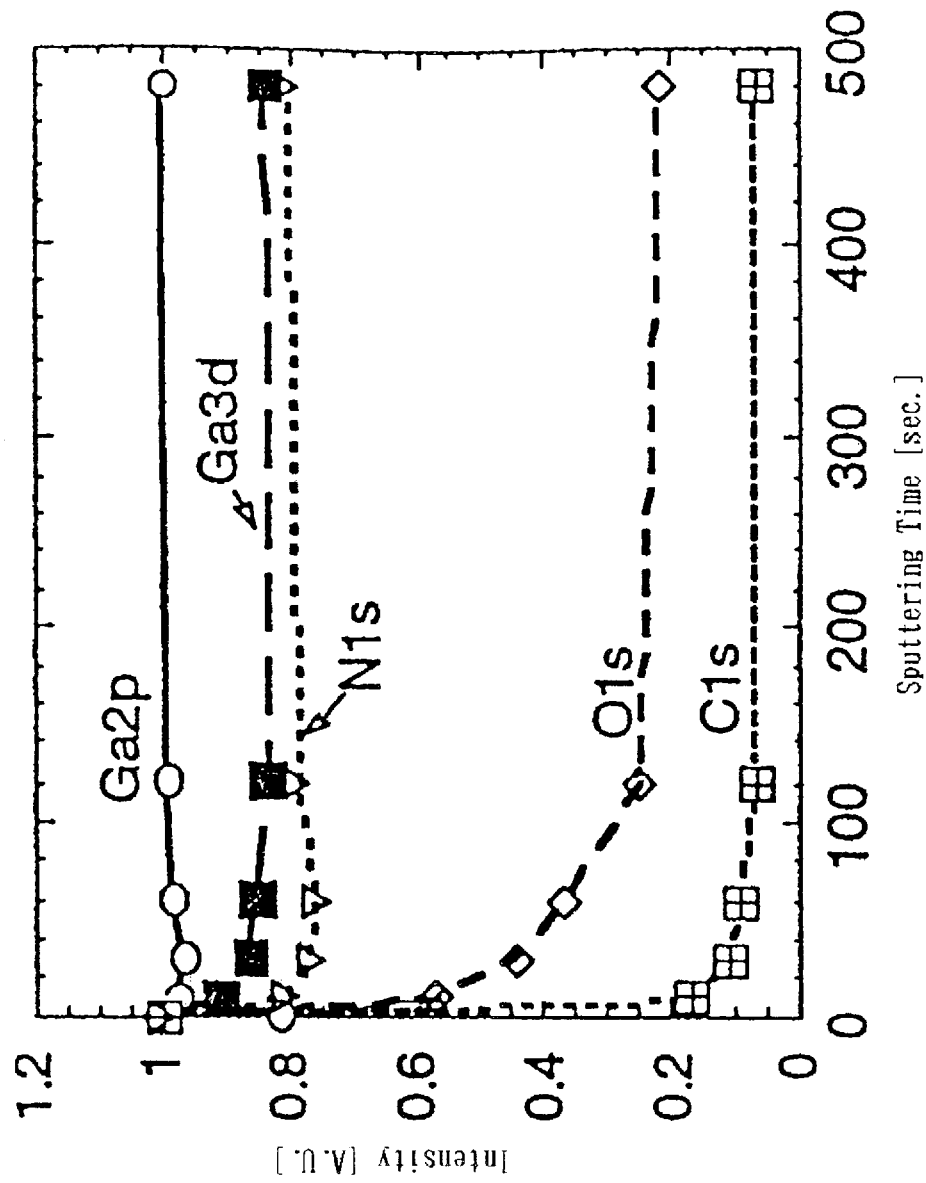
FIG. 3 is a graph showing the relation between spectrum intensity from each element of a sample and sputtering time with argon (Ar)

Then, altering the sputtering time with Ar, elements including oxygen (O1s) and carbon (C1s) on the surface crystal of the GaN layer were measured by XPS. As shown in FIG. 3, sputtering with Ar for about 120 sec. removed oxygen (O1s) and carbon (C1s) from the surface of the GaN layer although other elements of mother atoms such as Ga2p, Ga3d, and N1s remained unchanged.

EXAMPLE 2

As shown in FIG. 4, a light-emitting semiconductor device 100 made of GaN compound was manufactured utilizing the above described cleaning method of a surface. It has a sapphire ($Al_2O_3$) substrate 1 upon which a 500 Å in thickness of aluminum nitride (AlN) buffer layer 2 is formed. Consecutively, two n-type layers are formed on the AlN buffer layer 2: about 5.0 μm in thickness of silicon (Si) doped GaN forms an n$^+$-layer 3 of high carrier concentration having an electron concentration of $5 \times 10^{18}/cm^3$; and about 0.5 μm in thickness of Si-doped GaN forms an n-type clad layer 4 having an electron concentration of $5 \times 10^{17}/cm^3$.

On the n-type clad layer 4, an emission layer 5 of InGaN about 0.5 μm in thickness is formed being doped with silicon (Si) and zinc (Zn). Three p-layers are formed on the emission layer 5: about 1.0 μm in thickness of Mg-doped $Al_{x1}Ga_{1-x1}N$ forms a p-layer 61 which acts as a clad layer having a hole concentration of $5 \times 10^{17}/cm^3$ and an Mg concentration of $1 \times 10^{20}/cm^3$; about 0.2 μm in thickness of Mg-doped GaN forms a p-layer 62 which acts as a second contact layer having a hole concentration of $5 \times 10^{17}/cm^3$ and an Mg concentration of $1 \times 10^{20}/cm^3$; and about 500 Å in thickness of Mg-doped GaN forms a p-layer 63 as a first contact layer having a hole concentration of $2 \times 10^{17}/cm^3$ and an Mg concentration of $2 \times 10^{20}/cm^3$. Nickel electrodes 7 and 8 are each connected to the first contact layer 63 and to the n$^+$-layer 3, respectively. They are electrically insulated from one another by a groove A.

The LED 100 is produced by gaseous phase epitaxial growth, called metal organic vapor phase epitaxy, referred to as MOVPE hereinafter.

The gases employed in this process are ammonia ($NH_3$), a carrier gas ($H_2$ or $N_2$), trimethyl gallium ($Ga(CH_3)_3$) (TMG hereinafter), trimethyl aluminum ($Al(CH_3)_3$) (TMA hereinafter), trimethyl indium ($In(CH_3)_3$) (TMI hereinafter), diethylzinc (($Zn(C_2H_2)_2$) (DEZ hereinafter), silane ($SiH_4$), and biscyclopentadienyl magnesium ($Mg(C_5H_5)_2$) ($CP_2Mg$ hereinafter).

The single crystalline sapphire substrate 1, whose main surface 'a' was cleaned by an organic washing solvent and heat treatment, was placed on a susceptor in a MOVPE device for the MOVPE treatment. Then the sapphire substrate 1 was baked at 1100° C. by a vapor of $H_2$ fed into the device at a flow rate of 2 liter/min. under normal (atmospheric) pressure for a period of 30 min.

A 500 Å in thickness of AlN buffer layer 2 was formed on the surface 'a' of the etched sapphire substrate 1 under conditions controlled by lowering the temperature in the chamber to 400° C., keeping the temperature constant, and concurrently supplying for a period of 90 sec. $H_2$ at a flow rate of 20 liter/min., $NH_3$ at 10 liter/min., and TMA at $1.8 \times 10^{-5}$ mol/min. About 2.0 μm in thickness of Si-doped GaN, an n$^+$-layer 3 of high carrier concentration with an electron concentration of about $2 \times 10^{18}/cm^3$, was formed on the buffer layer 2 under conditions controlled by keeping the temperature of the sapphire substrate 1 at 1150° C. and concurrently supplying for 30 min. $H_2$ at a flow rate of 15 liter/min., $NH_3$ at 8 liter/min., TMG at $1.7 \times 10^4$ mol/min., and silane diluted to 0.86 ppm by $H_2$ at $5 \times 10^{-8}$ liter/min.

The LED 100 of this example is designed to emit light having a peak wavelength of 500 nm in the luminous spectrum and having luminous centers of Zn and Si.

About 2.0 μm in thickness of Si-doped GaN forms an n-type clad layer 4 with an electron concentration of $5 \times 10^{17}/cm^3$, was formed on the n$^+$-layer 3 under conditions controlled by keeping the temperature of the sapphire substrate 1 at 1000° C. and concurrently supplying for 20 min. $N_2$ or $H_2$ at a flow rate of 10 liter/min., $NH_3$ at 10 liter/min., TMG at $1.12 \times 10^{-4}$ mol/min., and silane diluted to 0.86 ppm by $H_2$ at $8 \times 10^{-9}$ mol/min.

About 0.5 μm in thickness of Zn- and Si-doped $In_{0.08}Ga_{0.92}N$ emission layer 5 was formed on the n-type clad layer 4 under conditions controlled by keeping the temperature of the sapphire substrate 1 at 850° C. and concurrently supplying for 4 min. $N_2$ or $H_2$ at a flow rate of 20 liter/min., $NH_3$ at 10 liter/min., TMG at $1.53 \times 10^{-4}$ mol/min. TMI at $0.02 \times 10^{-4}$ mol/min., DEZ at $2 \times 10^{-4}$ mol/min., and silane diluted to 0.86 ppm by $H_2$ at $10 \times 10^{-9}$ mol/min. The impurity concentrations of Zn and Si doped into the emission layer 5 were $5 \times 10^{18}/cm^3$ and $5 \times 10^{18}/cm^3$, respectively.

About 1.0 μm in thickness of Mg-doped $Al_{0.1}Ga_{0.9}N$ p-layer 61 was formed on the emission layer 5 under conditions controlled by keeping the temperature of the sapphire substrate 1 at 1000° C. and concurrently supplying for 20 min. $N_2$ or $H_2$ at a flow rate of 10 liter/min., $NH_3$ at 10 liter/min., TMG at $1.12 \times 10^{-4}$ mol/min., TMA at $0.47 \times 10^{-4}$ mol/min., and $CP_2Mg$ at $2 \times 10^{-4}$ mol/min. The resistivity of the p-layer 61 was $10_8$ $\Omega\cdot cm$ or more, exhibiting insulating characteristics. The impurity concentration of Mg doped into the p-layer 61 was $1 \times 10^{20}/cm^3$.

About 0.2 μm in thickness of Mg-doped GaN, second contact layer 62, was formed on the p-layer 61 under conditions of keeping the temperature of the sapphire substrate 1 at 1000° C. and concurrently supplying for 10 min. $N_2$ or $H_2$ at a flow rate of 10 liter/min., $NH_3$ at 10 liter/min., TMG at $1.12 \times 10^{-4}$ mol/min., and $CP_2Mg$ at $1 \times 10^{-4}$ mol/ min. The resistivity of the p-layer 62 was $10^8$ Ω·cm or more exhibiting insulating characteristics. The impurity concentration of Mg doped into the GaN layer 62 was $1\times10^{20}/cm^3$.

About 500 Å in thickness of Mg-doped GaN, first contact layer 63, was formed on the GaN layer 62 under conditions of controlled by keeping the temperature of the sapphire substrate 1 at 1000° C. and concurrently supplying for 2 min. $N_2$ or $H_2$ at a flow rate of 10 liter/min., $NH_3$ at 10 liter/min., TMG at $1.12\times10^{-4}$ mol/min., and $CP_2Mg$ at $4\times10^{-4}$ mol/min. The resistivity of the first contact layer 63 was $10^8$ Ω·cm or more, exhibiting insulating characteristics. The impurity concentration of Mg doped into the GaN layer 63 was $2\times10^{20}/cm^3$.

Figure 5:
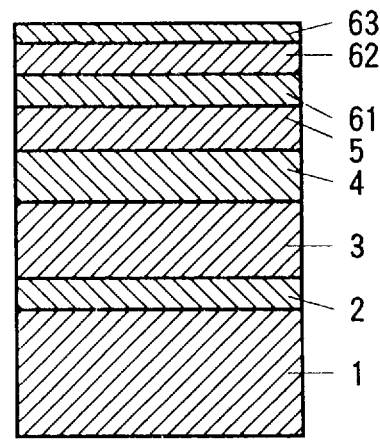
FIGS. 5 through 8 are sectional views illustrating successive steps of producing the LED in Example 2.

Then, electron rays were uniformly irradiated into the first contact layer 63, the second contact layer 62, and the p-layer 61 using a reflective electron beam diffraction device. The irradiation conditions were set at 10 KV for the accelerating voltage, 1 μA for the sample current, 0.2 mm/sec. for the speed of the scanning beam, 60 μmφ for the beam aperture, and at $5.0\times10^5$ Torr vacuum. This irradiation changed the insulative first contact layer 63, second contact layer 62 and p-layer 61 into a p-type conductive semiconductor with a hole concentration of $5\times10^{17}/cm^3$, $5\times10^{17}/cm^3$, and $2\times10^{17}/cm^3$ and a resistivity of 0.5 Ω·cm, 0.8 Ω·cm, and 1.5 Ω·cm, respectively. As a result, a wafer with a multi-layer structure was obtained as shown in FIG. 5.

Figure 6:
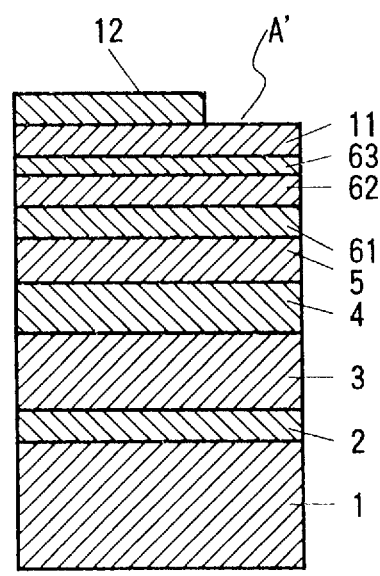
Figure 7:
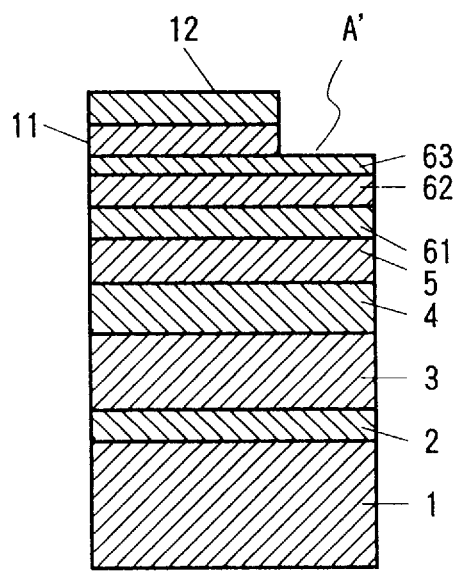
Figure 8:
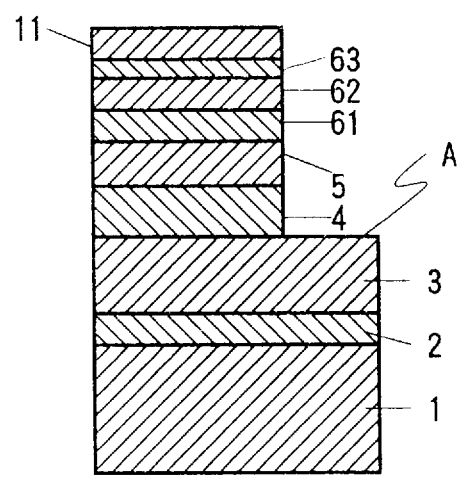

FIGS. 6 to 8 show sectional views of the formations of an individual device on the wafer. In actual practice and in accordance with industry custom, a wafer with a large number of elements thereon is treated by the following process and divided or diced into individual devices.

A 2000 Å thick $SiO_2$ layer 11 was formed on the first contact layer 63 by sputtering. Then, the layer 11 was coated with a photoresist layer 12. A selected part or an area of the photoresist layer 12, named A', was removed by photolithography as shown in FIG. 6.

As shown in FIG. 7, a part of the $SiO_2$ layer 11 which was not covered with the photoresist layer 12 was etched off by an etching liquid such as hydrofluoric acid. Then, the exposed part of the successive layers from the surface of the device, or the first contact layer 63, to the n-layer 3, were removed by dry etching, or supplying a high-frequency power density of 0.44 W/cm² and $BCl_3$ gas of 10 ml/min. at a vacuum degree of 0.04 Torr as shown in FIG. 8. After that, dry etching with argon (Ar) was carried out onto the device. Consequently, a hole A for forming an electrode extending to the n-layer 3 was formed.

The $SiO_2$ layer 11 remaining on the GaN p-layer 63 was removed by hydrofluoric acid. Then, the semiconductor substrate was placed on a target in the reaction chamber and its surface layer, or the p-layer 63 and some part or area of the n-layer 3 which was exposed, was sputtered with argon ion (Ar+) under the same conditions as described in Example 1. Then, the semiconductor substrate was replaced with a metal target and moved to be placed on the susceptor. A nickel layer was deposited on the entire surface of the semiconductor substrate by sputtering the metal target. Through necessary processes including laminating photoresist, photolithography, and etching, nickel electrodes 7 and 8 were formed.

The resulting device had an enhanced luminous intensity and an increased endurance.

Although nickel was used as the material of the electrode layer in Examples 1 and 2, one or more of aluminum (Al), gold (Au), and titanium (Ti) can be used, alternatively. Vacuum physical deposition can be used instead of sputtering deposition in order to form the electrode layer. Although the electrode was formed in the sputtering device for sputtering and alloying, it can be transferred to a vacuum deposition device without being exposed to the air, alternatively. There, an electrode layer can be deposited on the substrate by electron beam deposition, resistive heat deposition and so on, and alloying process can be carried out by heat treatment using a lamp and so forth as an alternate. Argon (Ar) was used as the inert gas for sputtering in Examples 1 and 2. Alternatively, helium (He), neon (Ne), xenon (Xe) can be used.

While the invention has been described in connection with what are presently considered to be preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of forming electrodes on a compound semiconductor including at least gallium (Ga) and nitride (N) and having a surface layer, said method comprising the steps of:

sputtering said surface layer as a target with an inert gas; and depositing an electrode layer on said surface layer without exposing said surface layer treated by said sputtering to an outer air.

2. The method according to claim 1, said step of depositing said electrode layer is performed under vacuum condition, further comprising the steps of:

replacing said compound semiconductor with a metal target;

placing said compound semiconductor on a susceptor; and sputtering said metal target.

3. The method according to claim 1, wherein said depositing said electrode layer is performed by sputtering metal, or heating and evaporating metal, in a vacuum chamber.

4. The method according to claim 1, wherein said step of sputtering said surface layer as a target with said inert gas is performed until said surface layer has a disruption layer having a surface irregularity and a disordered lattice arrangement at the level of lattice size.

5. The method according to claim 1, further comprising alloying said surface layer after said step of depositing said electrode layer without exposing said electrode layer to an outer air.

6. The method according to claim 1, wherein said electrode layer is formed under vacuum successively after said surface layer is sputtered as a target.

7. The method according to claim 1, wherein said surface layer is alloyed under vacuum successively after said electrode layer is formed.

8. The method according to claim 1, wherein said inert gas is argon (Ar).

9. A method of manufacturing a light-emitting device compound semiconductor including at least gallium (Ga) and nitride (N), said method comprising the steps of:

successively forming an n-layer, an emission layer, and a p-layer on a substrate;

etching some part or area of said p-layer and said emission layer for exposing some part or area of said n-layer;

sputtering surfaces of said p-layer and exposed part of said n-layer as a target with an inert gas; and depositing an electrode layer over said surfaces of said p-layer and said exposed part or area of said n-layer without exposing said surfaces treated by said sputtering to an outer air.

10. The method according to claim 9, wherein said sputtering is performed until said p-layer and said exposed part of said n-layer have a disruption layer having a surface irregularity and a disordered lattice arrangement at the level of lattice size.

11. The method according to claim 9, further comprising alloying said p-layer and said exposed part of said n-layer after said depositing said electrode layer without exposing said electrode layer to an outer air.

12. The method according to claim 9, wherein said electrode layer is formed under vacuum successively after sputtering surfaces of said p-layer and exposed part of said n-layer as a target with an inert gas.

13. The method according to claim 9, wherein said p-layer and said exposed part of said n-layer are alloyed under vacuum successively after said electrode layer is formed.

14. The method according to claim 9, wherein said inert gas is argon (Ar).

* * * * *

UNITED STATES PATENT AND TRADEMARK OFFICE
CERTIFICATE OF CORRECTION

PATENT NO. : 5,811,319

DATED : September 22, 1998

INVENTOR(S) : Koike, et al

It is certified that error appears in the above-identified patent and that said Letters Patent is hereby corrected as shown below:

On the Title Page, Item [73] reads:

Assignee: Toyoda Gosei Co., Ltd., Aichi-ken, Japan

Should Read:

[73] Assignees: Toyoda Gosei Co., Ltd., Aichi-ken, Japan; Research Development Corporation of Japan, Saitama-ken, Japan Signed and Sealed this Third Day of April, 2001

*Attest:*

NICHOLAS P. GODICI

*Attesting Officer*       *Acting Director of the United States Patent and Trademark Office*